United States Patent
Kim et al.

(10) Patent No.: US 10,468,604 B2
(45) Date of Patent: Nov. 5, 2019

(54) LATERAL P-N JUNCTION BLACK PHOSPHORUS THIN FILM, AND METHOD OF MANUFACTURING THE SAME

(71) Applicant: KOREA RESEARCH INSTITUTE OF STANDARDS AND SCIENCE, Daejeon (KR)

(72) Inventors: Ansoon Kim, Daejeon (KR); Songwoung Hong, Daejeon (KR); Jeong Won Kim, Daejeon (KR); Hyuksang Kwon, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 0 days.

(21) Appl. No.: 15/393,173

(22) Filed: Dec. 28, 2016

(65) Prior Publication Data

US 2018/0175303 A1   Jun. 21, 2018

(30) Foreign Application Priority Data

Dec. 19, 2016   (KR) .................. 10-2016-0173752

(51) Int. Cl.
*H01L 21/02* (2006.01)
*H01L 51/00* (2006.01)
(Continued)

(52) U.S. Cl.
CPC .......... *H01L 51/0067* (2013.01); *C01B 25/02* (2013.01); *H01L 29/24* (2013.01);
(Continued)

(58) Field of Classification Search
CPC ...... C01B 25/006; C09K 15/14; C09K 15/28; H01L 51/0084; H01L 51/0558; H01L 29/735; H01L 21/761; H01L 51/0039; H01L 51/0043; H01L 29/861; H01L 51/0067; C07F 9/06; A61K 41/0057; A61K 41/0052

See application file for complete search history.

(56) References Cited

U.S. PATENT DOCUMENTS

| | | | |
|---|---|---|---|
| 2017/0033192 A1* | 2/2017 | Wang | H01L 29/786 |
| 2017/0117493 A1* | 4/2017 | Engel | H01L 51/0545 |
| 2017/0174516 A1* | 6/2017 | Wang | C07C 309/04 |

FOREIGN PATENT DOCUMENTS

JP   2015090984 A   5/2014

OTHER PUBLICATIONS

Xuechao Yu, Shengli Zhang, Haibo Zeng Qi Jie Wang; Lateral Black Phosphorene P-N Junctions Formed Via Chemical Doping OFR High Performance Near Infrared Photodetector; Apr. 20, 2016 https://www.sciencedirect.com/science/article/pii/S2211285516300854 (Year: 2016).*

* cited by examiner

*Primary Examiner* — Roy K Potter
(74) *Attorney, Agent, or Firm* — McCoy Russell LLP

(57) ABSTRACT

Provided are a lateral p-n junction black phosphorus thin film, and a method of manufacturing the same, and specifically, a lateral p-n junction black phosphorus thin film in which a p-type black phosphorus thin film having a p-type semiconductor property and a n-type black phosphorus thin film having a n-type semiconductor property form a lateral junction by modifying some regions on a surface of the black phosphorus thin film through light irradiation with a compound having a specific chemical structure, and a method of manufacturing the same.

10 Claims, 3 Drawing Sheets

(51) Int. Cl.
  *C01B 25/02* (2006.01)
  *H01L 29/70* (2006.01)
  *H01L 29/66* (2006.01)
  *H01L 29/861* (2006.01)
  *H01L 29/24* (2006.01)
  *H01L 51/42* (2006.01)
  *H01L 51/05* (2006.01)
  *H01L 29/778* (2006.01)
(52) U.S. Cl.
  CPC ........ *H01L 29/66969* (2013.01); *H01L 29/70* (2013.01); *H01L 29/861* (2013.01); *H01L 29/778* (2013.01); *H01L 51/0015* (2013.01); *H01L 51/05* (2013.01); *H01L 51/0558* (2013.01); *H01L 51/0575* (2013.01); *H01L 51/42* (2013.01)

LATERAL P-N JUNCTION BLACK PHOSPHORUS THIN FILM, AND METHOD OF MANUFACTURING THE SAME

CROSS-REFERENCE TO RELATED APPLICATIONS

This application claims priority under 35 U.S.C. § 119 to Korean Patent Application No. 10-2016-0173752, filed on Dec. 19, 2016, in the Korean Intellectual Property Office, the entire disclosure of which is incorporated herein by reference in its entirety for all purposes.

TECHNICAL FIELD

The following disclosure relates to a lateral p-n junction black phosphorus thin film, and a method of manufacturing the same, and more specifically, to a lateral p-n junction black phosphorus thin film in which a p-type black phosphorus thin film having a p-type semiconductor property and a n-type black phosphorus thin film having a n-type semiconductor property form a lateral junction by modifying some regions on a surface of the black phosphorus thin film through light irradiation with a compound having a specific chemical structure, and a method of manufacturing the same.

BACKGROUND

A graphene has attracted great expectations from materials such as next generation displays, electronic devices, and photoelectric devices due to excellent properties such as physical and chemical stabilities, electric conductivity, charge mobility, flexibility, transparency, etc.

However, unlike semiconductor materials in which electrical conductivity is easily controlled through a finite band gap at a Fermi level, the graphene has a limit in that it is difficult to control the electric conductivity because the graphene does not have the band gap.

In order to overcome the limitations in unique physical properties of the graphene, a research has been continuously studied to induce formation of the band gap on a graphene electron band structure. However, since the graphene has a partial lattice symmetry that protects a Dirac point on a Dirac electron band structure, which is present in a single atomic layer, it is very difficult to manipulate the graphene.

Accordingly, different two-dimensional semiconductor materials having a band gap in a natural state unlike the graphene have been intensively focused.

The two-dimensional semiconductor materials, which are the first to be spotlighted, are transition metal chalcogen compounds such as $MoS_2$, $MoSe_2$, $MoTe_2$, $WS_2$ or $WSe_2$, etc., and have band gaps in the range of about 1.4 to 2.0 eV, which makes it much easier to control electric conductivity as compared to the graphene. However, these two-dimensional semiconductor materials have limitations in that charge mobility is much lower than that of the graphene, and is similar to those of silicon and germanium (Japanese Patent Laid-Open Publication No. 2015-090984).

Accordingly, black phosphorus has newly emerged as a two-dimensional semiconductor material in recent years. The black phosphorus is a material composed of phosphorus (P) atoms, which has an atomic arrangement of puckered honeycomb structures similar to graphene. However, the black phosphorus has advantages in that the electric conductivity is easily controlled and the charge mobility is excellent by having an appropriate size of band gap value between graphene having a band gap value of 0 eV and a transition metal chalcogen compound having a band gap value between 1.4 and 2.0 eV.

When a transistor is manufactured by using the black phosphorus as a material, there is a limitation in that the charge mobility is decreased since black phosphorus which is a p-type semiconductor and a different material which is a n-type semiconductor form a hetero-junction in a vertical direction to manufacture the transistor.

Therefore, the present inventors found that when a homo-junction black phosphorus thin film is manufactured by converting some regions of the black phosphorus into a n-type semiconductor in order to prevent the decrease in charge mobility, the decrease in charge mobility due to charge transfer between different materials could be prevented, and completed the present invention.

RELATED ART DOCUMENT (Patent Document 1) Japanese Patent Laid-Open Publication No. JP 2015-090984 (May 11, 2015)

SUMMARY

An embodiment of the present invention is directed to providing a lateral p-n junction black phosphorus thin film in which a p-type black phosphorus thin film having a p-type semiconductor property and a n-type black phosphorus thin film having a n-type semiconductor property form a lateral junction by modifying some regions on a surface of the black phosphorus thin film through light irradiation with a compound having a specific chemical structure, and a method of manufacturing the same.

In addition, another embodiment of the present invention is directed to providing a n-type black phosphorus thin film in which a p-type semiconductor property which is a unique property of the black phosphorus thin film is converted into a n-type semiconductor property by modifying a surface of the black phosphorus thin film through light irradiation with a compound having a specific chemical structure, and a method of manufacturing the same.

In one general aspect, there is provided a lateral p-n junction black phosphorus thin film in which a p-type black phosphorus thin film and a n-type black phosphorus thin film form a lateral junction.

The n-type black phosphorus thin film may be surface-modified by a diazirine compound represented by Chemical Formula 1 below to have a n-type semiconductor property:

[Chemical Formula 1]

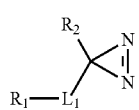

in Chemical Formula 1, $L_1$ is a direct bond, C1-C20 alkylene group, C5-C30 cycloalkylene group, C6-C30 arylene group, or a combination thereof, and $R_1$ and $R_2$ are each independently C1-C20 alkyl group, C5-C30 cycloalkyl group, C6-C30 aryl group, C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof, wherein at least one hydrogen in the alkylene group, cycloalkylene group, arylene group, alkyl group, cycloalkyl group, aryl group, alkoxy group, and hydroxyalkyl group is each independently unsubstituted or substituted with a substituent, the substituent being C1-C20 alkyl group, C1-C20 alkoxy group, C1-C20 hydroxyalkyl group, C5-C30 cycloalkyl group, C6-C30 aryl group, halogen group, or amino group.

The diazirine compound may be represented by Chemical Formula 2 below:

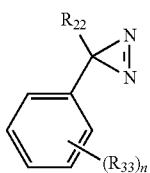

[Chemical Formula 2]

in Chemical Formula 2, $R_{22}$ and $R_{33}$ are each independently C1-C20 alkoxy group, C1-C20 hydroxyalkyl group, halogen group, amine group, nitro group, sulfonic acid group or C1-C20 heteroalkyl group including at least one heteroatom in which electronegativity is 2.5 or more, and n is an integer of 1 to 3.

Linewidths of the n-type black phosphorus thin film and the p-type black phosphorus thin film may be each independently 100 to 100,000 nm.

In another general aspect, there is provided a semiconductor device including the lateral p-n junction black phosphorus thin film as described above.

The semiconductor device may be a diode, a transistor, a thyristor, an optical device, a solar cell, or an integrated circuit, etc.

In still another general aspect, there is provided a method of manufacturing a lateral p-n junction black phosphorus thin film including: a) coating a surface of a black phosphorus thin film with a diazirine compound represented by Chemical Formula 1 below; b) forming a patterned photomask on an upper part of the black phosphorus thin film coated with the diazirine compound; and c) modifying a region exposed by the photomask into a n-type black phosphorus thin film through light irradiation:

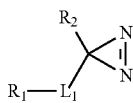

[Chemical Formula 1]

in Chemical Formula 1, $L_1$ is a direct bond, C1-C20 alkylene group, C5-C30 cycloalkylene group, C6-C30 arylene group, or a combination thereof, and $R_1$ and $R_2$ are each independently C1-C20 alkyl group, C5-C30 cycloalkyl group, C6-C30 aryl group, C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof, wherein at least one hydrogen in the alkylene group, cycloalkylene group, arylene group, alkyl group, cycloalkyl group, aryl group, alkoxy group, and hydroxyalkyl group is each independently unsubstituted or substituted with a substituent, the substituent being C1-C20 alkyl group, C1-C20 alkoxy group, C1-C20 hydroxyalkyl group, C5-C30 cycloalkyl group, C6-C30 aryl group, halogen group, or amino group.

The light irradiation in c) may be performed for 1 to 60 minutes at a light quantity of 1 to 1000 W.

The light may have a wavelength of 200 to 500 nm.

In still another general aspect, there is provided a n-type black phosphorus thin film which is surface-modified by a diazirine compound represented by Chemical Formula 1 below.

In still another general aspect, there is provided a method of manufacturing a n-type black phosphorus thin film including: A) coating a surface of a black phosphorus thin film with a diazirine compound represented by Chemical Formula 1 below; and B) modifying the surface of the black phosphorus thin film into the n-type black phosphorus thin film through light irradiation:

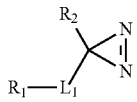

[Chemical Formula 1]

in Chemical Formula 1, $L_1$ is a direct bond, C1-C20 alkylene group, C5-C30 cycloalkylene group, C6-C30 arylene group, or a combination thereof, and $R_1$ and $R_2$ are each independently C1-C20 alkyl group, C5-C30 cycloalkyl group, C6-C30 aryl group, C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof, wherein at least one hydrogen in the alkylene group, cycloalkylene group, arylene group, alkyl group, cycloalkyl group, aryl group, alkoxy group, and hydroxyalkyl group is each independently unsubstituted or substituted with a substituent, the substituent being C1-C20 alkyl group, C1-C20 alkoxy group, C1-C20 hydroxyalkyl group, C5-C30 cycloalkyl group, C6-C30 aryl group, halogen group, or amino group.

DETAILED DESCRIPTION OF EMBODIMENTS

Figure 1A:
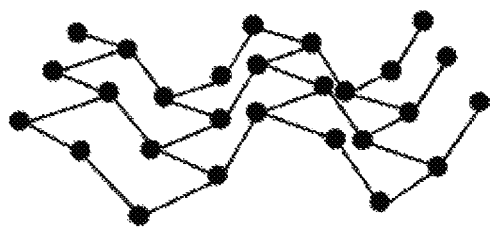
FIG. 1A shows a structure of black phosphorus in three dimensions, and FIG. 1B schematically shows a structure of the black phosphorus in two dimensions.
Figure 1B:
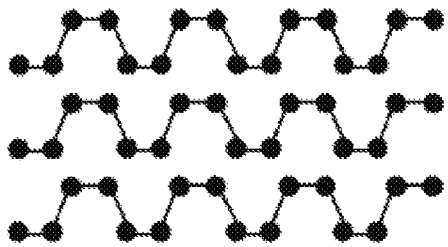

Hereinafter, a lateral p-n junction black phosphorus thin film of the present invention, and a method of manufacturing the same are described in detail with reference to the accompanying drawings. These drawings of the present invention to be described below are provided by way of example so that the idea of the present invention can be sufficiently transferred to those skilled in the art to which the present invention pertains. Therefore, the present invention may be implemented in many different forms, without being limited to the drawings to be described below. The drawings may be exaggerated in order to specify the spirit of the present invention. Like reference numerals denote like elements throughout the specification.

Meanwhile, unless technical and scientific terms used herein are defined otherwise, they have meanings generally understood by those skilled in the art to which the present invention pertains. Known functions and components will be omitted so as not to obscure the description of the present invention with unnecessary detail.

Terms 「alkyl」, 「alkylene」, 「alkoxy」 and 「hydroxyalkyl」 as used in the present invention include both linear and branched forms, and 「cycloalkyl」 refers to an organic radical derived from a substituted hydrocarbon by removal of one hydrogen, and preferably has 1 to 5 ring structures, wherein the ring may be a single or fused ring system, and may even include a form of a plurality of rings that are connected by a single bond. Specific examples of the cycloalkyl group may include cyclopentyl, cyclohexyl, etc. Term 「aryl」 refers to an organic radical derived from an aromatic hydrocarbon by removal of one hydrogen, and preferably has 1 to 5 ring structures, wherein the ring may be a single or fused ring system, and may even include a form of a plurality of rings that are connected by a single bond. Specific examples of the aryl group include aromatic groups such as phenyl, naphthyl, biphenyl, indenyl, fluorenyl, phenanthrenyl, anthracenyl, triphenylenyl, pyrenyl, crycenyl or naphthacenyl, etc. Term 「cycloalkylene」 refers to an organic radical derived from alicyclic hydrocarbons by removal of two hydrogens, and term 「arylene」 refers to an organic radical derived from aromatic hydrocarbons by removal of two hydrogens.

In addition, unless otherwise specified in the present invention, a term 'black phosphorus thin film' means a p-type black phosphorus thin film having a p-type semiconductor property, and a black phosphorus thin film having a n-type semiconductor property obtained by modifying a surface thereof refers to a n-type black phosphorus thin film.

Further, unless otherwise specified in the present invention, a term 'diazirine compound' may refer to a diazirine compound represented by Chemical Formula 1.

A black phosphorus is a phosphorus allotrope in which phosphorus (P) atoms are two-dimensionally bonded to each other so as to have a puckered honeycomb structure as shown in FIG. 1A, which has received attention as a semiconductor material since electric conductivity is easily controlled and charge mobility is excellent.

Since the black phosphorus basically has the p-type semiconductor property, a conventional p-n junction device is manufactured by forming a vertical junction with a different two-dimensional material having a n-type semiconductor property. However, in this case, there is a limitation in transfer of charges.

Accordingly, the present inventors suggested a method in which the semiconductor property of the black phosphorus is capable of being easily changed, and a lateral p-n junction black phosphorus thin film capable of overcoming a charge transfer limit by forming the lateral junction between the black phosphorus having the n-type semiconductor property and the black phosphorus having the p-type semiconductor property, and a method of manufacturing the same.

Figure 3:
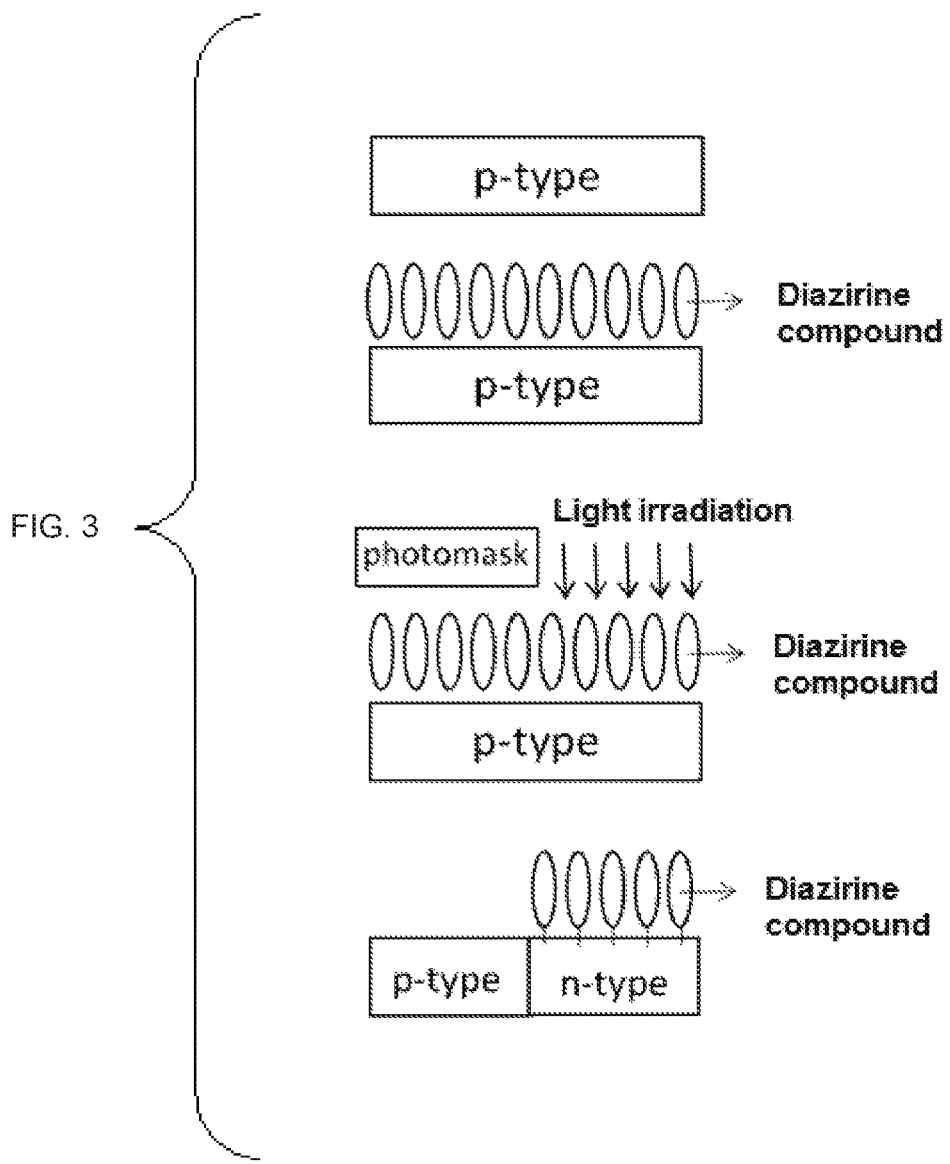
FIG. 3 is a process diagram sequentially and schematically showing a method of manufacturing a lateral p-n junction black phosphorus thin film according to the present invention.

Specifically, the lateral p-n junction black phosphorus thin film according to an exemplary embodiment of the present invention means a black phosphorus thin film in which the p-type black phosphorus thin film and the n-type black phosphorus thin film form a lateral junction, and specifically, a homo-junction black phosphorus thin film in which the p-type black phosphorus thin film and the n-type black phosphorus thin film are connected in series, as shown in FIG. 3.

Here, the p-type black phosphorus thin film and the n-type black phosphorus thin film form a homo-junction through selective surface-modification from one black phosphorus thin film, such that a phosphorus atom of the p-type black phosphorus thin film and a phosphorus atom of the n-type black phosphorus thin film may be connected to each other through a covalent bond, thereby effectively preventing a decrease in charge mobility.

In addition, respective linewidths of the n-type black phosphorus thin film and the p-type black phosphorus thin film may be adjusted differently according to the plan. For example, the linewidths of the p-type black phosphorus thin film and the n-type black phosphorus thin film may be each independently 100 to 100,000 nm, and more preferably, 100 to 5000 nm, but is not necessarily limited thereto.

More specifically, the n-type black phosphorus thin film according to an exemplary embodiment of the present invention may be surface-modified by a diazirine compound represented by Chemical Formula 1 below to have a n-type semiconductor property:

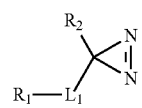

[Chemical Formula 1]

in Chemical Formula 1, $L_1$ is a direct bond, C1-C20 alkylene group, C5-C30 cycloalkylene group, C6-C30 arylene group, or a combination thereof, and $R_1$ and $R_2$ are each independently C1-C20 alkyl group, C5-C30 cycloalkyl group, C6-C30 aryl group, C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof, wherein at least one hydrogen in the alkylene group, cycloalkylene group, arylene group, alkyl group, cycloalkyl group, aryl group, alkoxy group, and hydroxyalkyl group is each independently unsubstituted or substituted with a substituent, the substituent being C1-C20 alkyl group, C1-C20 alkoxy group, C1-C20 hydroxyalkyl group, C5-C30 cycloalkyl group, C6-C30 aryl group, halogen group, or amino group.

Figure 2:
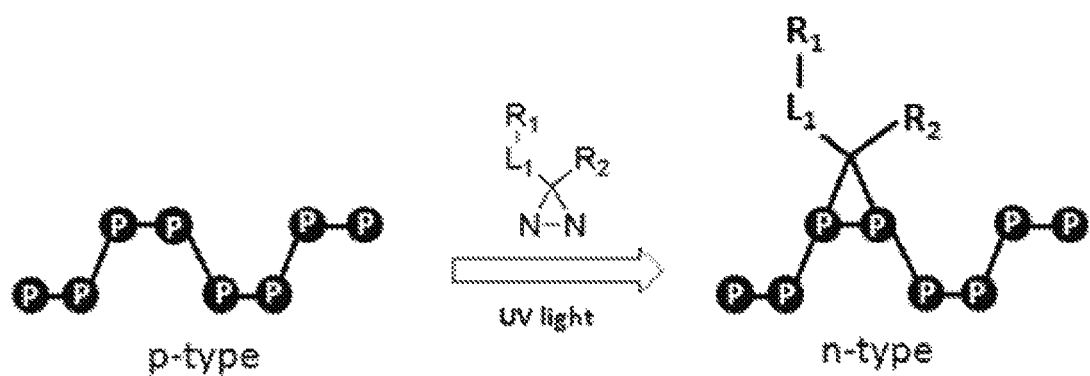
FIG. 2 schematically shows a principle in which a p-type black phosphorus thin film is modified into a n-type black phosphorus thin film according to the present invention.

As described above, when the surface of the black phosphorus thin film is modified by the diazirine compound represented by Chemical Formula 1, as shown in FIG. 2, a nitrogen (N) atom of a diazirine group is substituted with a phosphorus (P) atom constituting the black phosphorus thin film to form a covalent bond on the surface of the black phosphorus thin film, such that the diazirine compound gives electrons to the black phosphorus thin film, which may convert the p-type semiconductor property of the black phosphorus thin film into the n-type semiconductor property.

That is, by modifying a partial surface of the conventional black phosphorus thin film having the p-type semiconductor property with the diazirine compound represented by Chemical Formula 1, the n-type black phosphorus thin film having the n-type semiconductor property may be formed, and the lateral p-n junction black phosphorus thin film may be manufactured from the n-type black phosphorus thin film.

By providing the homogeneous lateral p-n junction black phosphorus thin film in which the n-type black phosphorus thin film and the p-type black phosphorus thin film are connected in series as described above, a charge transfer limit according to the vertical junction between the n-type semiconductor and the p-type semiconductor may be overcome, such that it is possible to provide a semiconductor device having more excellent electrical conductivity and charge mobility.

Here, in the present invention, the 'heteroatom in which electronegativity is 2.5 or more' means an atom having a stronger electronegativity than that of the phosphorus (P) atom. Specifically, for example, it means any one or two or more heteroatoms selected from F, Cl, Br, I, O, N, S, and Se. As a more specific example, the C1-C20 heteroalkyl group including at least one heteroatom in which electronegativity is 2.5 or more may be —$CF_3$, —$C(CF_3)_3$, etc., and the C5-C30 heterocycloalkyl group including at least one heteroatom in which electronegativity is 2.5 or more may be a tetrahydrofuranyl group (—$C_4H_6O$), a tetrahydropyranyl group (—$C_5H_8O$), etc., and the C6-C30 heteroaryl group including at least one heteroatom in which electronegativity is 2.5 or more may be a furanyl group (—$C_4H_3O$), a pyranyl group (—$C_5H_4O$), etc., but is not necessarily limited thereto.

Further, in the present invention, the 'surface-modified by a diazirine compound represented by Chemical Formula 1' means that the surface of the black phosphorus thin film is coated with the diazirine compound represented by Chemical Formula 1, and the light irradiation is performed to modify the surface of the black phosphorus thin film, wherein a final state of the compound bonded to the surface of the black phosphorus thin film is not the diazirine compound represented by Chemical Formula 1, and as shown in FIG. 2, the nitrogen (N) atom of the diazirine group is decomposed into a nitrogen molecule ($N_2$) by light, and a carbon bonded to the nitrogen atom of the diazirine group is transformed into carbene having high chemical reactivity, and reacted with the phosphorus (P) atom constituting the black phosphorus thin film, and thus, the diazirine compound represented by Chemical Formula 1 is covalently bonded to the surface of the black phosphorus thin film.

Specifically, in the diazirine compound represented by Chemical Formula 1 according to an exemplary embodiment of the present invention, $L_1$ is C1-C20 alkylene group, C5-C30 cycloalkylene group, C6-C30 arylene group, or a combination thereof, and $R_1$ and $R_2$ are each independently C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof.

More specifically, in the diazirine compound represented by Chemical Formula 1, $L_1$ is C6-C30 arylene group, and $R_1$ and $R_2$ are each independently C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof.

More specifically, the diazirine compound represented by Chemical Formula 1 according to an exemplary embodiment of the present invention may be represented by Chemical Formula 2 below:

[Chemical Formula 2]

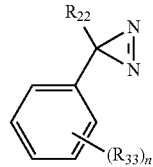

in Chemical Formula 2, $R_{22}$ and $R_{33}$ are each independently C1-C20 alkoxy group, C1-C20 hydroxyalkyl group, halogen group, amine group, nitro group, sulfonic acid group or C1-C20 heteroalkyl group including at least one heteroatom in which electronegativity is 2.5 or more, and n is an integer of 1 to 3.

When the diazirine compound satisfying Chemical Formula 2 is used as a surface-modifying material, the diazirine group and the phosphorus atom may be effectively reacted with each other by the light irradiation, such that a specific region of the surface of the black phosphorus thin film to which light is irradiated may be effectively modified. A surface of a black phosphorus thin film having a thin thickness is very easily oxidized when exposed to oxygen, whereas the surface of the black phosphorus thin film that is surface-modified by diazirine compound may solve a surface-oxidation problem as described above.

On the other hand, as described above, the lateral p-n junction black phosphorus thin film may be manufactured by selectively modifying the some regions of the surface of the black phosphorus thin film.

Here, the black phosphorus thin film may be peeled off from a black phosphorus lump, and may be a laminate of a plurality of layers of phosphorene composed of one atomic layer. Specifically, the black phosphorus thin film may be a laminate of 1 to 100 layers, and more preferably 1 to 30 layers of phosphorene, but is not necessarily limited thereto.

Specifically, the method of manufacturing a lateral p-n junction black phosphorus thin film according to an exemplary embodiment of the present invention may include: a) coating a surface of a black phosphorus thin film with a diazirine compound represented by Chemical Formula 1 below; b) forming a patterned photomask on an upper part of the black phosphorus thin film coated with the diazirine compound; and c) modifying a region exposed by the photomask into a n-type black phosphorus thin film through light irradiation. The semiconductor property of the specific region of the black phosphorus thin film may be effectively changed to n-type according to the above-described method.

[Chemical Formula 1]

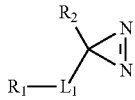

in Chemical Formula 1,

L$_1$ is a direct bond, C1-C20 alkylene group, C5-C30 cycloalkylene group, C6-C30 arylene group, or a combination thereof, and R$_1$ and R$_2$ are each independently C1-C20 alkyl group, C5-C30 cycloalkyl group, C6-C30 aryl group, C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof, wherein at least one hydrogen in the alkylene group, cycloalkylene group, arylene group, alkyl group, cycloalkyl group, aryl group, alkoxy group, and hydroxyalkyl group is each independently unsubstituted or substituted with a substituent, the substituent being C1-C20 alkyl group, C1-C20 alkoxy group, C1-C20 hydroxyalkyl group, C5-C30 cycloalkyl group, C6-C30 aryl group, halogen group, or amino group.

First, a step of a) coating the surface of the black phosphorus thin film with the diazirine compound represented by Chemical Formula 1 may be performed.

Here, since the diazirine compound represented by Chemical Formula 1 is the same as the diazirine compound described above, overlapped descriptions are omitted.

More specifically, step a) may be performed by coating the surface of the black phosphorus thin film with a modifying solution including the diazirine compound represented by Chemical Formula 1.

Specifically, the modifying solution may include the diazirine compound represented by Chemical Formula 1 and an organic solvent. Here, the organic solvent is preferably a solvent capable of effectively dissolving the diazirine compound represented by Chemical Formula 1 and being not decomposed or modified by the light to be irradiated while without being reactive to the diazirine compound represented by Chemical Formula 1. As an example, the organic solvent may be any one or two or more selected from water such as distilled water, purified water, etc.; alcohol-based solvents such as methanol, ethanol, methoxyethanol, propanol, isopropanol, butanol, isobutanol, etc.; alkane-based solvents such as pentane, hexane, heptane, cyclohexane, etc.; ketone-based solvents such as acetone, methyl ethyl ketone, methyl isobutyl ketone, etc.; ester-based solvents such as ethyl acetate, butyl acetate, 3-methoxy-3-methylbutyl acetate, etc.; amine-based solvents such as dimethylformamide, dimethylsulfoxide, methyl pyrrolidone, dimethyl acetamide, etc.; ether-based solvents such as tetrahydrofuran, 2-methyltetrahydrofuran, dimethylether, dibutylether, etc.; etc., but is not necessarily limited thereto.

In an example of the present invention, a concentration of the diazirine compound in the modifying solution may be controlled depending on a desired degree of modification, a surface area of the black phosphorus thin film, an amount of the modifying solution, etc. As a specific example, the concentration of the diazirine compound in the modifying solution may be 1 μM to 100 M, preferably 1 to 100 mM, and more preferably, 1 to 25 mM. Within the above-described range, the surface of the black phosphorus thin film may be uniformly and effectively modified. When the amount of the diazirine compound in the modifying solution is significantly small, the surface of the black phosphorus thin film may not be uniformly modified. When the amount of the diazirine compound is significantly large, the diazirine compound may be coated excessively thick on the surface of the black phosphorus thin film, which may cause a problem of light scattering at the time of the light irradiation, and an unreacted diazirine compound may not be clearly removed later.

In an example of the present invention, a coating method is not specifically limited, but the coating method may be performed by applying the modifying solution on the surface of the black phosphorus thin film by spin coating, bar coating, dip coating, etc., or by immersing the black phosphorus thin film in the modifying solution.

Next, a step of b) forming a patterned photomask on an upper part of the black phosphorus thin film coated with the diazirine compound may be performed.

In an example of the present invention, the method of forming a photomask is not specifically limited as long as it is a commonly used method in the art. For example, the photomask may be formed by positioning a photomask patterned in a planned form on an upper part of the black phosphorus thin film coated with the diazirine compound or by positioning the patterned photomask through physical contact on the surface of the black phosphorus thin film coated with the diazirine compound. The photomask has a region which is previously patterned to block light by chromium on a soda lime glass substrate or a quartz substrate which is conventionally used, and a line width W of the pattern may be 100 to 100,000 nm.

Next, a step of c) modifying a region exposed by the photomask into a n-type black phosphorus thin film through light irradiation may be performed. By irradiating light to the exposed part of the surface of the black phosphorus thin film coated with the modifying solution as described above, the diazirine compound and the black phosphorus thin film are optically reacted with each other, and as shown in FIG. 2, the nitrogen (N) atom of the diazirine group is substituted with the phosphorus (P) atom constituting the black phosphorus thin film to form the covalent bond on the surface of the black phosphorus thin film, and therefore, the p-type semiconductor property of the black phosphorus thin film may be converted into the n-type semiconductor property.

In detail, the light irradiation in step C) may be performed for 1 to 60 minutes at a light quantity of 1 to 1000 W. More preferably, it is preferable to irradiate light for 1 to 30 minutes at a light quantity of 5 to 200 W, more preferably 5 to 20 minutes at a light quantity of 50 to 200 W, in view of a more effective light reaction. When the light quantity is excessively small or time for light irradiation is excessively short, the light reaction may not be properly generated, and when the light quantity is excessively large or the time for light irradiation is excessively long, it is not preferred since the black phosphorus thin film and the diazirine compound may be damaged.

In this case, the light may be ultraviolet light, more specifically, a light having a wavelength range of 200 to 500 nm, and more preferably, a light having a wavelength range of 254 to 400 nm, and more preferably, a light having a wavelength range of 330 to 370 nm. However, the light is not limited thereto, and may be mixed with several wavelengths of lights, or a single wavelength light.

Then, a step of removing the photomask and removing the diazirine compound which is unreacted with the surface of the black phosphorus thin film may be further performed. The photomask may be removed by a conventional method, and the diazirine compound may be removed with a second organic solvent. Here, the second organic solvent may be an organic solvent of the modifying solution, and may be the same as or different kinds of solvent.

Further, the lateral p-n junction black phosphorus thin film according to the present invention may be applied as a material of a semiconductor device. In detail, the semiconductor device according to an exemplary embodiment of the present invention may include a lateral p-n junction black phosphorus thin film, wherein the semiconductor device is not specifically limited in view of kind as long as it is capable of applying the black phosphorus thin film, but specifically, the semiconductor device may be, for example, a diode, a transistor, a thyristor, an optical device, a solar cell, or an integrated circuit, etc. That is, the lateral p-n junction black phosphorus thin film in which the n-type black phosphorus thin film and the p-type black phosphorus thin film form a homo-junction may be used as the semiconductor device such as the diode, the transistor, the thyristor, the optical device, the solar cell, or the integrated circuit, etc., but is not necessarily limited thereto.

In addition, although only the lateral p-n junction black phosphorus thin film in which the surface of the black phosphorus thin film is selectively modified, and the method of manufacturing the same are described, the present invention also provides a n-type black phosphorus thin film in which a surface of the black phosphorus thin film is entirely modified, and a method of manufacturing the same.

Specifically, the n-type black phosphorus thin film may be surface-modified by the diazirine compound represented by Chemical Formula 1 below, and more specific descriptions of the diazirine compound are the same as those described above, and thus, overlapped descriptions are omitted:

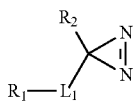

[Chemical Formula 1]

in Chemical Formula 1,

L₁ is a direct bond, C1-C20 alkylene group, C5-C30 cycloalkylene group, C6-C30 arylene group, or a combination thereof, and R₁ and R₂ are each independently C1-C20 alkyl group, C5-C30 cycloalkyl group, C6-C30 aryl group, C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof, wherein at least one hydrogen in the alkylene group, cycloalkylene group, arylene group, alkyl group, cycloalkyl group, aryl group, alkoxy group, and hydroxyalkyl group is each independently unsubstituted or substituted with a substituent, the substituent being C1-C20 alkyl group, C1-C20 alkoxy group, C1-C20 hydroxyalkyl group, C5-C30 cycloalkyl group, C6-C30 aryl group, halogen group, or amino group.

The n-type black phosphorus thin film may be manufactured by the following method.

A method of manufacturing the n-type black phosphorus thin film according to an exemplary embodiment of the present invention may include: A) coating a surface of a black phosphorus thin film with a diazirine compound represented by Chemical Formula 1 below; and B) modifying a surface of the black phosphorus thin film into the n-type black phosphorus thin film through light irradiation, and in the method of manufacturing the lateral p-n junction black phosphorus thin film, the surface of the black phosphorus thin film may be modified into the diazirine compound by the same method except that only some regions of the black phosphorus thin film coated with the diazirine compound are exposed by using the patterned photomask in b):

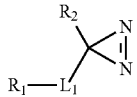

[Chemical Formula 1]

in Chemical Formula 1,

L₁ is a direct bond, C1-C20 alkylene group, C5-C30 cycloalkylene group, C6-C30 arylene group, or a combination thereof, and R₁ and R₂ are each independently C1-C20 alkyl group, C5-C30 cycloalkyl group, C6-C30 aryl group, C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof, wherein at least one hydrogen in the alkylene group, cycloalkylene group, arylene group, alkyl group, cycloalkyl group, aryl group, alkoxy group, and hydroxyalkyl group is each independently unsubstituted or substituted with a substituent, the substituent being C1-C20 alkyl group, C1-C20 alkoxy group, C1-C20 hydroxyalkyl group, C5-C30 cycloalkyl group, C6-C30 aryl group, halogen group, or amino group.

Hereinafter, the lateral p-n junction black phosphorus thin film of the present invention, and a method of manufacturing the same are described in more detail through Examples. Meanwhile, the following Examples are provided as a reference for explaining the present invention in detail, and therefore, the present invention is not limited thereto, but may be implemented in various ways. Unless defined otherwise, all technical and scientific terms used herein have the same meanings generally understood by those skilled in the art to which the present disclosure pertains. Terms used in the specification of the present invention are to effectively describe specific exemplary embodiments, but are not intended to limit the present invention. It is intended that singular forms used in the appended specification and claims include plural forms unless otherwise indicated in the context. In addition, additives are used in unit of wt % unless specifically described in the specification.

Example 1

FDBA (4-[3-(trifluoromethyl)-3H-diazirin-3-yl]benzyl alcohol) was mixed in n-hexane to prepare a FDBA solution (10 mM). Then, the black phosphorus thin film was immersed in the solution to coat a surface of the black phosphorus thin film with the FDBA. A photomask was placed on an upper part of the FDBA-coated black phosphorus thin film, and then, light of 365 nm was irradiated to a region exposed by the photomask for 10 minutes at a light quantity of 100 W. Then, the light-irradiated black phosphorus thin film was washed with hexane to remove unreacted FDBA, thereby manufacturing a lateral p-n junction black phosphorus thin film.

Comparative Example 1

A black phosphorus thin film of which a surface is not modified was prepared.

Comparative Example 2

The light irradiation was performed in the same manner as in Example 1 except that the surface of the black phosphorus thin film was not coated with the FDBA solution.

Comparative Example 3

All processes were performed in the same manner as in Example 1 except that the light irradiation was not performed.

[Result Analysis]

Figure 4:
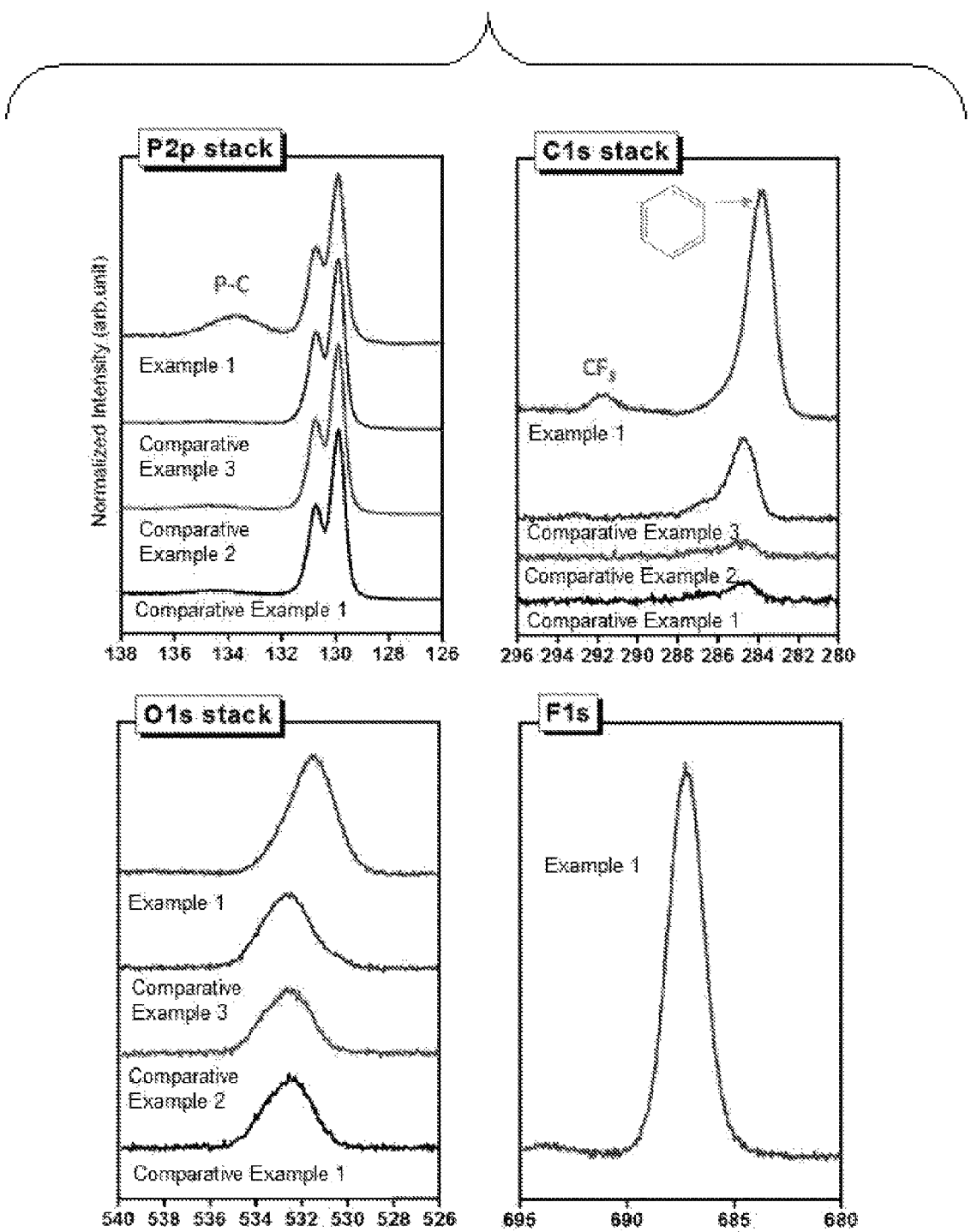
FIG. 4 shows results of X-ray photoelectron spectroscopy (XPS) spectrum analysis of Example 1 and Comparative Examples 1 to 3.

FIG. 4 shows results of X-ray photoelectron spectroscopy (XPS) spectrum analysis of Example 1 and Comparative Examples 1 to 3. In Example 1, a peak of P—P bond shown at 129-131 eV, and a peak of C—P bond shown at 132-136 eV were observed in a P2p graph, and a benzene ring peak shown at 282 to 284 eV and a $CF_3$ peak shown at 291 to 293 eV were observed in a C1s graph, and a peak by $CF_3$ of the FDBA molecule was observed at 685 to 690 eV in a F1s graph, and thus, it could be appreciated that the FDBA and the black phosphorus thin film were effectively light-reacted with each other to form a C—P bond, such that the surface of the black phosphorus thin film was effectively modified. On the other hand, it could be appreciated that in Comparative Examples 1 to 3, the C—P bond was not generated at all, and $CF_3$ of the FDBA molecule was not formed on the surface of the black phosphorus, and thus, the surface of the black phosphorus thin film was not modified only by coating with the FDBA solution or the irradiation of ultraviolet rays.

Comparative Example 4

All processes were performed to modify a surface of a black phosphorus thin film in the same manner as in Example 1 except that 4-methoxybenzene diazonium tetrafluoroborate was used.

Unlike Example 1 in which the black phosphorus thin film had the n-type semiconductor property through the surface-modification, Comparative Example 4 showed a strong p-type semiconductor property, and thus, the result thereof was completely opposite to that of Example 1.

The present invention may provide the n-type black phosphorus thin film having a n-type semiconductor property by modifying the surface of the conventional black phosphorus thin film having a p-type semiconductor property with the diazirine compound represented by Chemical Formula 1.

In addition, some regions on the surface of the black phosphorus thin film may be selectively surface-modified, and accordingly, it is possible to provide the lateral p-n junction black phosphorus thin film in which the n-type black phosphorus thin film and the p-type black phosphorus thin film are connected in series.

As described above, the present invention may provide the lateral p-n junction black phosphorus thin film in which the n-type black phosphorus thin film and the p-type black phosphorus thin film are connected in series. Therefore, it is possible to overcome a charge transfer limit according to hetero-junction or vertical junction between the n-type semiconductor and the p-type semiconductor, thereby providing a semiconductor device having more excellent electrical conductivity and charge mobility.

Although preferred embodiments of the present invention are described above, the present invention should be construed as including all the changes, modification, and equivalent, such that it is obvious that the present invention may be equivalently utilized by appropriately modifying the above-described exemplary embodiments. Therefore, the above-description is not intended to limit the scope of the present invention defined by limitation of the following claims.

What is claimed is:

1. A lateral p-n junction black phosphorus thin film in which a p-type black phosphorus thin film and a n-type black phosphorus thin film form a lateral junction,
   wherein the n-type black phosphorus thin film is surface-modified by a diazirine compound represented by Chemical Formula 1 below to have a n-type semiconductor property

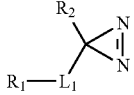

[Chemical Formula 1]

in Chemical Formula 1,
L1 is a direct bond, C1-C20 alkylene group, C5-C30 cycloalkylene group, C6-C30 arylene group, or a combination thereof, and
R1 and R2 are each independently C1-C20 alkyl group, C5-C30 cycloalkyl group, C6-C30 aryl group, C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof,
wherein at least one hydrogen in the alkylene group, cycloalkylene group, arylene group, alkyl group, cycloalkyl group, aryl group, alkoxy group, and hydroxyalkyl group is each independently unsubstituted or substituted with a substituent, the substituent being C1-C20 alkyl group, C1-C20 alkoxy group, C1-C20 hydroxyalkyl group, C5-C30 cycloalkyl group, C6-C30 aryl group, halogen group, or amino group.

2. The lateral p-n junction black phosphorus thin film of claim 1, wherein the diazirine compound is represented by Chemical Formula 2 below:

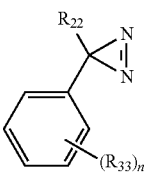

[Chemical Formula 2]

in Chemical Formula 2, $R_{22}$ and $R_{33}$ are each independently C1-C20 alkoxy group, C1-C20 hydroxyalkyl group, halogen group, amine group, nitro group, sulfonic acid group or C1-C20 heteroalkyl group including at least one heteroatom in which electronegativity is 2.5 or more, and n is an integer of 1 to 3.

3. The lateral p-n junction black phosphorus thin film of claim 1, wherein linewidths of the n-type black phosphorus thin film and the p-type black phosphorus thin film are each independently 100 to 100,000 nm.

4. A semiconductor device comprising the lateral p-n junction black phosphorus thin film of claim 1.

5. The semiconductor device of claim 4, wherein the semiconductor device is a diode, a transistor, a thyristor, an optical device, a solar cell, or an integrated circuit.

6. A method of manufacturing a lateral p-n junction black phosphorus thin film comprising:
   a) coating a surface of a black phosphorus thin film with a diazirine compound represented by Chemical Formula 1 below;
   b) forming a patterned photomask on an upper part of the black phosphorus thin film coated with the diazirine compound; and
   c) modifying a region exposed by the photomask into a n-type black phosphorus thin film through light irradiation:

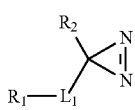

[Chemical Formula 1]

in Chemical Formula 1, $L_1$ is a direct bond, C1-C20 alkylene group, C5-C30 cycloalkylene group, C6-C30 arylene group, or a combination thereof, and $R_1$ and $R_2$ are each independently C1-C20 alkyl group, C5-C30 cycloalkyl group, C6-C30 aryl group, C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof, wherein at least one hydrogen in the alkylene group, cycloalkylene group, arylene group, alkyl group, cycloalkyl group, aryl group, alkoxy group, and hydroxyalkyl group is each independently unsubstituted or substituted with a substituent, the substituent being C1-C20 alkyl group, C1-C20 alkoxy group, C1-C20 hydroxyalkyl group, C5-C30 cycloalkyl group, C6-C30 aryl group, halogen group, or amino group.

7. The method of claim 6, wherein the light irradiation in c) is performed for 1 to 60 minutes at a light quantity of 1 to 1000 W.

8. The method of claim 7, wherein the light has a wavelength of 200 to 500 nm.

9. A n-type black phosphorus thin film which is surface-modified by a diazirine compound represented by Chemical Formula 1 below:

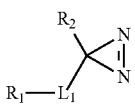

[Chemical Formula 1]

in Chemical Formula 1, $L_1$ is a direct bond, C1-C20 alkylene group, C5-C30 cycloalkylene group, C6-C30 arylene group, or a combination thereof, and $R_1$ and $R_2$ are each independently C1-C20 alkyl group, C5-C30 cycloalkyl group, C6-C30 aryl group, C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof, wherein at least one hydrogen in the alkylene group, cycloalkylene group, arylene group, alkyl group, cycloalkyl group, aryl group, alkoxy group, and hydroxyalkyl group is each independently unsubstituted or substituted with a substituent, the substituent being C1-C20 alkyl group, C1-C20 alkoxy group, C1-C20 hydroxyalkyl group, C5-C30 cycloalkyl group, C6-C30 aryl group, halogen group, or amino group.

10. A method of manufacturing a n-type black phosphorus thin film comprising:
    A) coating a surface of a black phosphorus thin film with a diazirine compound represented by Chemical Formula 1 below; and
    B) modifying the surface of the black phosphorus thin film into the n-type black phosphorus thin film through light irradiation:

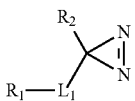

[Chemical Formula 1]

in Chemical Formula 1, $L_1$ is a direct bond, C1-C20 alkylene group, C5-C30 cycloalkylene group, C6-C30 arylene group, or a combination thereof, and $R_1$ and $R_2$ are each independently C1-C20 alkyl group, C5-C30 cycloalkyl group, C6-C30 aryl group, C1-C20 alkoxy group, C1-C20 hydroxyalkyl group, halogen group, amine group, nitro group, sulfonic acid group, C1-C20 heteroalkyl group including at least one heteroatom in which electronegativity is 2.5 or more, C5-C30 heterocycloalkyl group including at least one heteroatom in which electronegativity is 2.5 or more, C6-C30 heteroaryl group including at least one heteroatom in which electronegativity is 2.5 or more, or a combination thereof, wherein at least one hydrogen in the alkylene group, cycloalkylene group, arylene group, alkyl group, cycloalkyl group, aryl group, alkoxy group, and hydroxyalkyl group is each independently unsubstituted or substituted with a substituent, the substituent being C1-C20 alkyl group, C1-C20 alkoxy group, C1-C20 hydroxyalkyl group, C5-C30 cycloalkyl group, C6-C30 aryl group, halogen group, or amino group.

* * * * *